US006472740B1

United States Patent
Engel et al.

(10) Patent No.: US 6,472,740 B1
(45) Date of Patent: Oct. 29, 2002

(54) SELF-SUPPORTING AIR BRIDGE INTERCONNECT STRUCTURE FOR INTEGRATED CIRCUITS

(75) Inventors: Brett H. Engel, Fishkill, NY (US); Timothy J. Dalton, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/867,902

(22) Filed: May 30, 2001

(51) Int. Cl.⁷ .............................................. H01L 23/12
(52) U.S. Cl. .................... 257/704; 257/758; 257/522
(58) Field of Search ................................ 257/758, 522, 257/704, 750, 752

(56) References Cited

U.S. PATENT DOCUMENTS

| | | | |
|---|---|---|---|
| 4,503,597 A | * | 3/1985 | Kushima et al. |
| 4,559,697 A | * | 12/1985 | Sadmori |
| 5,324,683 A | | 6/1994 | Fitch et al. |
| 5,512,776 A | * | 4/1996 | Bayraktaroglu |
| 5,567,982 A | | 10/1996 | Bartelink |
| 5,750,415 A | | 5/1998 | Gnade et al. |
| 5,959,247 A | * | 9/1999 | Armstrong et al. |
| 5,998,293 A | | 12/1999 | Dawson et al. |
| 6,051,491 A | | 4/2000 | Ito et al. |
| 6,057,224 A | | 5/2000 | Bothra et al. |
| 6,097,092 A | | 8/2000 | Natzle |
| 6,400,014 B1 | * | 6/2002 | Huang et al. |

OTHER PUBLICATIONS

IBM Technical Disclosure Bulletin, vol. 15 No. 6 Nov. 1972, C.M. McIntosh and A. F. Schmeckenbecher, "Packaging of Integrated Circuits" pp. 1977–1980.
IBM Technical Disclosure Bulletin, vol. 15 No. 6 Nov. 1972, J. Garcia, D. A. Jeannotte, N. C. Mescia, T. F. Redmond and M. D. Reeber, "Air Board Controlled Impedance Package" pp. 1746–1747.

* cited by examiner

Primary Examiner—Sheila V. Clark
(74) Attorney, Agent, or Firm—Cantor Colburn LLP; Margaret Pepper

(57) ABSTRACT

A method for forming a multilevel interconnect structure for an integrated circuit is disclosed. In an exemplary embodiment of the invention, the method includes forming a starting structure upon a substrate, the starting structure having a number of metallic conducting lines contained therein. A disk is bonded to the top of said starting structure, the disk including a plurality of mesh openings contained therein. The mesh openings are then filled with an insulative material, thereby forming a cap upon the startig structure, wherein the cap may structurally support additional interconnect layers subsequently formed thereatop.

30 Claims, 5 Drawing Sheets

SELF-SUPPORTING AIR BRIDGE INTERCONNECT STRUCTURE FOR INTEGRATED CIRCUITS

BACKGROUND

The present invention relates generally to semiconductor device processing and, more particularly, to a self-supporting, multilevel air bridge interconnect structure having a low dielectric constant.

In the fabrication of integrated circuit devices, it is often desirable to isolate individual components of the integrated circuits from one another with insulative materials. Such insulative materials may include, for example, silicon dioxide, silicon nitride and silicon carbide. While these materials may have acceptable insulating properties in many applications, they also have relatively high dielectric constants, (e.g., $\kappa \approx 4$, $\kappa \approx 7$, $\kappa \approx 12$, respectively) which can lead to capacitive coupling between proximate conductive elements. This is particularly disadvantageous, given the ever-decreasing distances between conductive circuit elements, and the use of multi-layered structures. An unnecessary capacitive coupling between adjacent wires increases the RC time delay of a signal propagated therethrough, resulting in decreased device performance. Thus, for specific applications, insulating materials having relatively low dielectric constants (e.g., $\kappa < 3$) may be desired.

It is well known that air has a dielectric constant of about 1.0. While it is true that air has a very low dielectric constant, it is equally true that there are significant difficulties associated with constructing multilevel interconnect structures (e.g., dual damascene structures) utilizing air as a dielectric. Primarily, the task of providing adequate mechanical support for stacked metallization layers during the fabrication thereof, when air is used as the entire dielectric material, is quite daunting. As a result, the conventional processes for fabricating multilayered structures with air dielectrics have either been prohibitively expensive, have lacked adequate mechanical support, or have relied on excessive residual dielectric material.

BRIEF SUMMARY

The foregoing discussed drawbacks and deficiencies of the prior art are overcome or alleviated by a method for forming a multilevel interconnect structure for an integrated circuit. In an exemplary embodiment of the invention, the method includes forming a starting structure upon a substrate, the starting structure having a number of metallic conducting lines contained therein. A disk is bonded to the top of the starting structure, the disk including a plurality of mesh openings contained therein. The mesh openings are then filled with an insulative material, thereby forming a cap upon the starting structure, wherein the cap may structurally support additional interconnect layers subsequently formed thereatop.

In an alternative embodiment, the top of the starting structure is immersed in a liquid bath. The liquid bath is then cured into a solid surface, thereby forming a cap upon the starting structure. The cap may then structurally support additional interconnect layers subsequently formed thereatop. In still an alternative embodiment, a disk is bonded to the top of the starting structure, the disk including a plurality of mesh openings contained therein. The top of the starting structure, including the disk, is then immersed in a liquid bath. The liquid bath is cured into a solid surface, thereby filling the mesh openings with an insulative material and forming a cap upon the starting structure. The cap may then structurally support additional interconnect layers subsequently formed thereatop.

BRIEF DESCRIPTION OF THE DRAWINGS

Referring to the exemplary drawings wherein like elements are numbered alike in the several Figures.

DETAILED DESCRIPTION

Figure 1A:
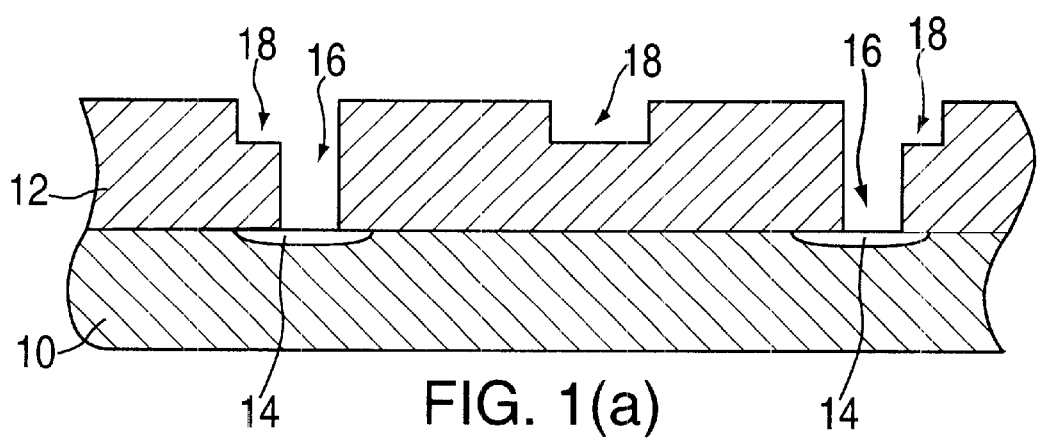
FIGS. 1(a)–1(e) through illustrate the steps for fabricating the first level of an existing metallic interconnect structure, used as a starting structure, in accordance with the embodiments of the present invention.

Referring initially to FIG. 1(a), a substrate 10 serves as the base for a first layer used as a starting structure in the formation of a multilayer interconnect structure. A dielectric material 12 (e.g., silicon dioxide) is formed atop substrate 10, which substrate may contain a number of active device areas 14 therein. Within the dielectric material 12, a number of vertical via openings 16 are formed, so as to later provide a conducting path from an active area 14 to a conductive metallization line formed thereafter. Via openings 16 may also provide a conducting path to another conductive line or another via. Concurrently, a number of metallization openings 18 are also formed, within which the metallization lines are eventually deposited. The via openings 16 and metallization openings 18 may be formed by existing dual damascene structure techniques, such as by applying a photoresist layer to the dielectric material 12, masking the photoresist to selectively expose regions where the via and metallization openings 16, 18 are to be located, and then etching away the portions of the dielectric 12 under the exposed photoresist.

Figure 1B:
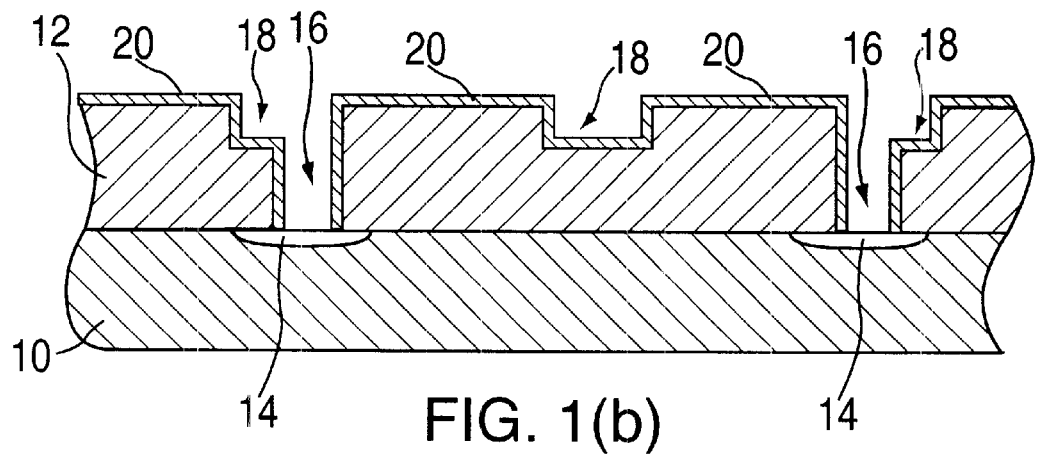

As shown in FIG. 1(b), once the openings 16, 18 are formed, a diffusion liner 20 made of a material such as titanium nitride (TiN) may be deposited within the openings 16, 18. Other suitable liner materials may include, but are not limited to Ti, Ta, TaN, W, Wn, TiSiN and TaSiN, or a composite of two or more materials thereof. The diffusion liner 20 may be deposited by sputtering or by chemical vapor deposition (CVD), followed by a rapid thermal process (RTP) or furnace heating.

Figure 1C:
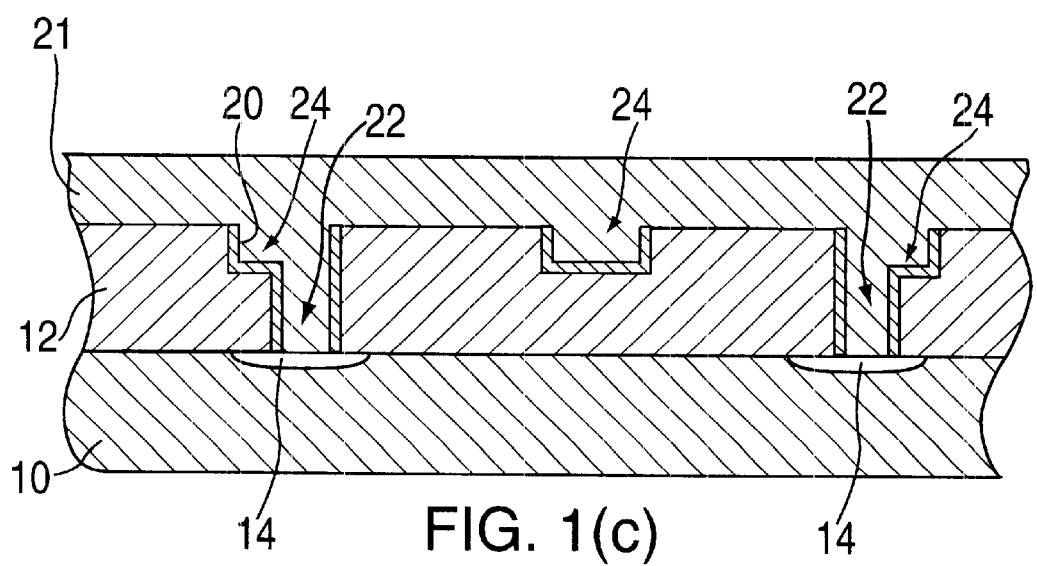

Next, in FIG. 1(c), the via openings 16 and the metallization openings 18 (with diffusion liner 20 therein) are then filled with a conductive material 21, such as tungsten, aluminum, copper, gold or silver, to form plugs (contacts) 22 and metallization lines 24. The plugs 22, in addition to providing structural support for subsequent layers (as described later), are used to establish an electrical interconnection between active areas 14 and the overlying metallization lines 24. Chemical vapor deposition may be utilized to fill the via openings 16 and the metallization openings 18 with the conductive material 21. Alternatively, techniques such as electrolytic plating or electrochemical plating may be used.

Figure 1D:
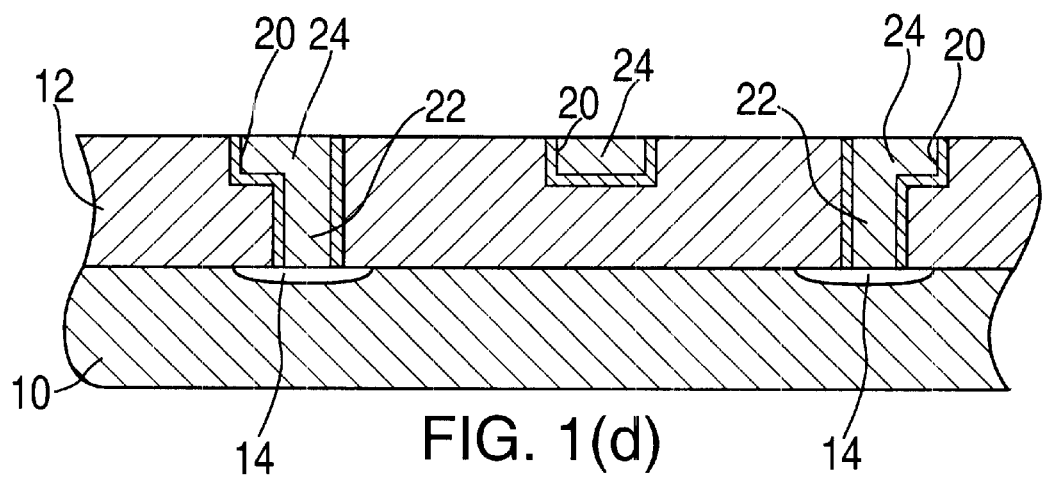

FIG. 1(d) illustrates the plugs 22 and metallization lines 24 after the excess conductive material 21 is removed and planarized, such as by chemical mechanical polishing. In the example illustrated, two of the metallization lines 24 are shown connected to active device areas 14 through plugs 22 in via openings 16. The other metallization line 24 is supported underneath entirely by dielectric material 12. Optionally, a layer or layers of hardmask (not shown) may then be formed atop dielectric material 12 and between metallization lines 24, as some dielectric materials may be sensitive to process conditions used in forming structures. In addition, a hardmask may also be used as a structural patterning aid, or as a stop layer for a chemical mechanical polishing step.

Figure 1E:
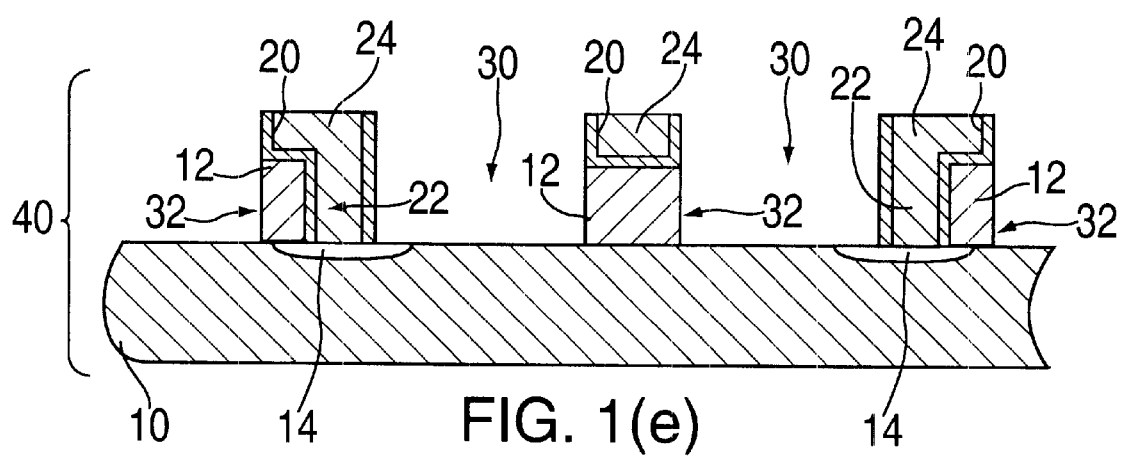

FIG. 1(e) illustrates the completion of the first layer. The dielectric material 12 (and any hardmask layer(s)) is anisotropically removed, with the exception of those portions of the dielectric material 12 directly underneath diffusion liners 20 containing metallization lines 24. Accordingly, the first layer comprises an air bridge layer, in that the resulting voids 30 (of air) created by the removal of the dielectric material 12 serve as the low-k dielectric insulator between the metallization lines 24 and the other device areas. The remaining portions of dielectric material 12 serve as supporting pillars 32 for metallization lines 24. However, it is also seen that the plugs 20, where present, provide primary structural support for metallization lines 24 running directly thereatop. Once completed, the first layer serves as a starting structure 40 for the formation of a multilayer interconnect structure, as described hereinafter.

Figure 2:
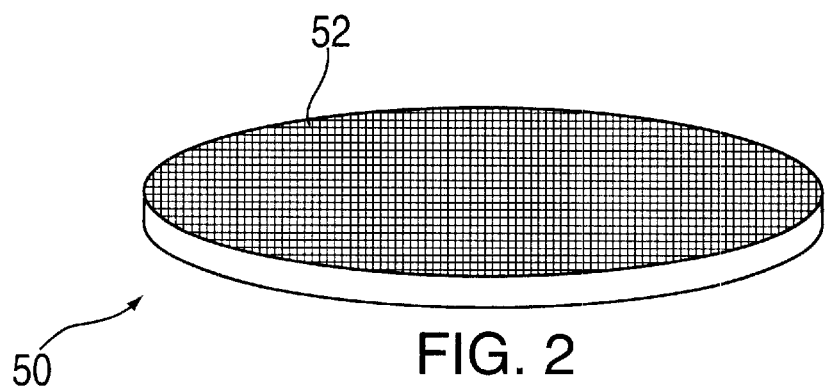
FIG. 2 is a perspective view of a prefabricated mesh disk used in accordance with an embodiment of the invention.

Referring now to FIG. 2, there is shown a non-conductive, prefabricated mesh disk 50 for bonding to the top of the starting structure 40, in accordance with an embodiment of the invention. The disk 50 features a plurality of small mesh openings 52, having a suitable size for the insertion of a sealing material therein. In the embodiment shown, the mesh openings are generally square in shape, although other shapes are contemplated. The size of openings 52 are chosen with regard to the thickness of the disk 50, and in view of the particular deposition process used to fill the openings 52. A preferable range for the size of openings 52 is about 50 nm to about 5 $\mu$m. In addition, the thickness of the disk 50 is selected so as to resist deformation over small spaces (e.g., 10 nm to 500 $\mu$m). Thus, a preferable thickness range for the disk 50 is about 10 nm to about 100 nm.

Figure 3:
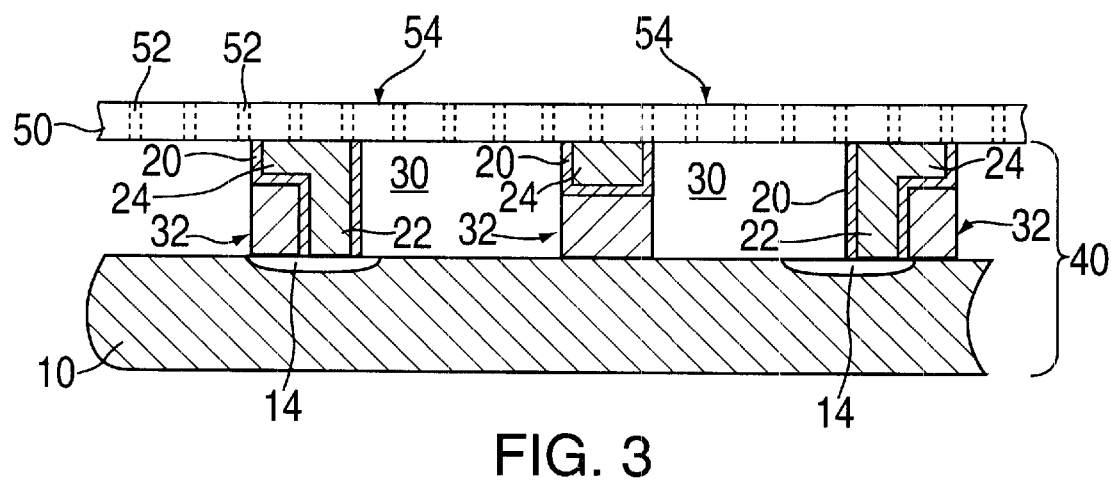
FIG. 3 is a cross-sectional view of the disk shown in FIG. 2 bonded to the starting structure shown in FIG. 1(e)

FIG. 3 is a cross-sectional view of the disk 50 bonded to the starting structure 40 shown in FIG. 1(e). Specifically, the disk 50 may be bonded thermally, or by a combination of temperature and pressure, or with a suitable adhesive. It will be noted that the width and spacing of openings 52 are shown as such in FIG. 3 for illustrative purposes only, and are not to be construed as limiting in any sense. At this point, the air in voids 30 may be left therein or evacuated to create a vacuum. Alternatively, the voids may be filled with a gas such as $N_2$, Ar, Xe, He, Kr or $SF_6$. Afterward, the openings 52 are then sealed up with dielectric material deposited therein (e.g., silicon nitride ($Si_3N_4$)) to form a continuous surface or cap 54 atop the disk 50. The deposition may be implemented by a non-conformal CVD or, alternatively, by a non-collimated physical vapor deposition (PVD) process. In either case, the deposition process is chosen so as not to have the deposited dielectric material pass through the openings 52, into voids 30, and upon the substrate 10 or active areas 14. This would result in an unnecessary increase in the overall dielectric constant.

Any additional thickness added to the disk 50 associated with the depositon process (as well as the original disk thickness itself) may be reduced by chemical mechanical polishing. Similarly, CMP may be used (following additional material deposition) to correct any planar deflection of the disk 50. Other processes which may be used to planarize the disk 50 include reactive ion etching (RIE) or wet etching. Once filled and sealed, mesh disk 50 may also serve as a barrier to prevent the upward diffusion of the conductive material from metallization lines 24 into the upper levels of the structure. Otherwise, an additional diffusion barrier layer may be added during the fabrication of the starting structure 40, prior to the bonding to the mesh disk 50 to the starting structure 40. After the openings 52 are filled with dielectric material (the excess material being polished away) and the cap 54 is formed, additional levels may be constructed thereupon (e.g., another layer beginning with the deposition of dielectric material 12, as described earlier).

Figure 4A:
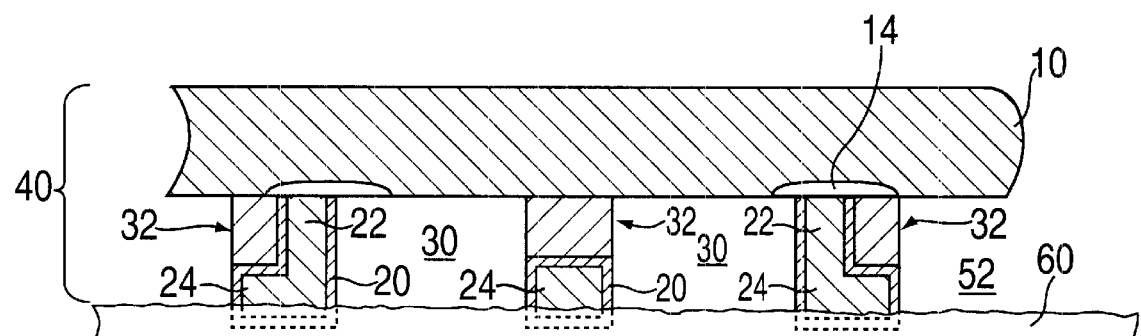
FIG. 4(a) is a cross-sectional view of the starting structure of FIG. 1(e), shown flipped and immersed in a liquid bath, in accordance with an alternative embodiment of the invention.

Referring now to FIGS. 4(a) and (b), an alternative embodiment for forming the cap 54 upon starting structure 40 is illustrated. Once completed, the starting structure 40 is flipped and placed in a liquid bath 60, as shown more particularly in FIG. 4(a). The liquid bath 60 is a dielectric material, preferably initially being in liquid form at temperatures below 450° C. before curing thereof. Once cured, liquid bath 60 should remain solid (or go through a glass transition) at temperatures below 450° C. In one aspect, the liquid bath 60 may have a known fluid height and the starting structure 40 may be submerged therein at a discrete depth, depending upon the desired thickness of the cap. In another aspect, the starting structure 40 may be placed upside down within a vessel having a thin film therein, with the starting structure 40 being supported by the plugs 22 and dielectric pillars 32. In either case, the liquid bath 60 is then cured by techniques such as epoxy-like timed curing, cooling below a melting temperature, or by irradiation, for example.

Figure 4B:
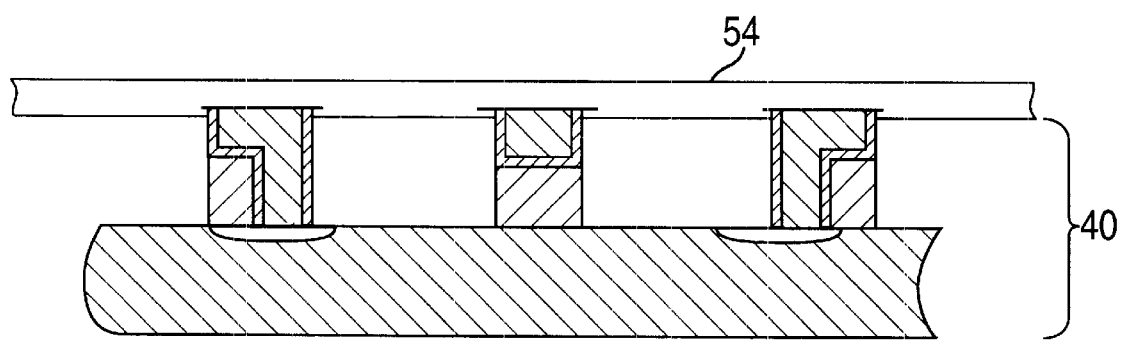
FIG. 4(b) illustrates the structure in FIG. 4(a), following the curing of the liquid bath material.

After curing, any excess cap material may be polished off with chemical mechanical polishing until a desired thickness for the cap 54 is achieved, as seen in FIG. 4(b). However, if the starting structure 40 is placed in a thin film, then only the desired thickness is deposited atop the starting structure 40, thereby potentially eliminating the need for a polishing step. Again, once the cap 54 is formed, additional interconnect levels may be formed on top of the cap.

Structurally speaking, it is preferred that wide space fill material be used for a "flipping and dipping" technique as described above. The space fill may comprise additional columns of conductive material or a combination of conductive and dielectric material. In either case, the space fill is used for structural support, in that the fill helps to resist deflection of the formed cap 54 after subsequent processing steps such as CMP. Naturally, the space fill locations are chosen so that no undesired short circuiting of active device components occurs.

Figure 5:
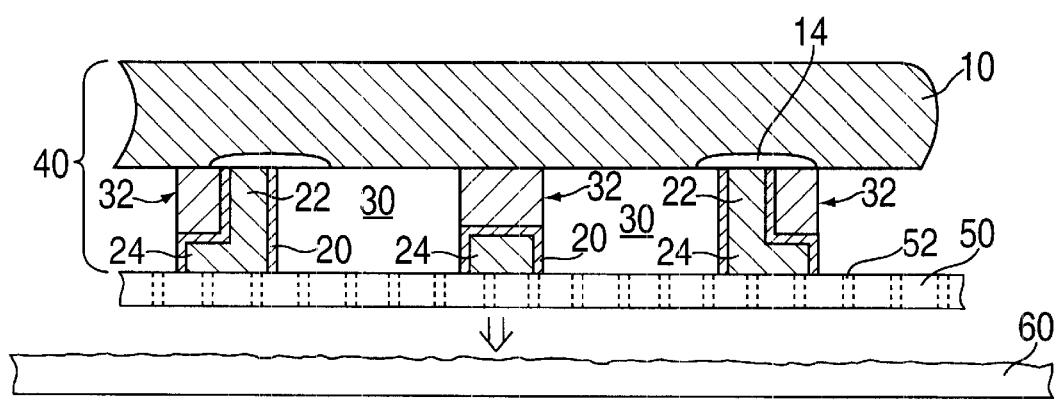
FIG. 5 is a cross-sectional view of the structure of FIG. 3, shown flipped for immersion in a liquid bath, in accordance with an alternative embodiment of the invention.

Finally, in still another embodiment illustrated in FIG. 5, the cap 54 may be formed by a combination of the above described embodiments. For example, the prefabricated mesh disk 50 may be bonded atop the starting structure 40. Instead of a CVD or PVD process to fill in the openings, however, the starting structure is flipped, and the disk 50 is immersed in the liquid bath 60. The disk 50, along with the mesh openings 52 therein provide added surface area and hence nucleation sites for the bath 60 to cure thereupon. In addition, the disk 50 provides mechanical support against deflection as the finished cap 54 is formed. Preferably, the disk 50 is of a catalytic material, which promotes curing and sealing of the openings 52 with the bath material. For example, the catalytic material may include mesoporous zeolites, possibly implanted with a heavy metal material such as platinum (Pt), palladium (Pd) or ruthenium (Ru). Again, the starting structure 40 and bonded disk 50 may be submerged within the bath 60 at a desired depth, or it may be placed in a vessel with a thin film of bath material. In either case, the bath 60 should be designed such that the bath material is not deposited into the voids 30 created by the removal of the dielectric material 12.

Regardless of the cap forming method used, it is seen that a multilayer interconnect structure, having an air bridge configuration, may be constructed one level at a time. Rather than isotropically removing dielectric material, the dielectric can be removed anisotropically, leaving just enough dielectric material for mechanical support of the plugs 22 and metallization lines 24. In this manner, the benefits of a structure having reduced dielectric construction, while maintaining mechanical integrity, are obtained. Furthermore, the above embodiments may be fabricated using inexpensive processes and technology.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A multilevel interconnect structure for an integrated circuit, comprising:
    a starting structure formed upon a substrate, said starting structure having a number of metallic conducting lines contained therein;
    a disk having a plurality of mesh openings contained therein, said disk being bonded to the top of said starting structure; and
    said mesh openings filled with an insulative material, thereby forming a cap upon said starting structure;
    wherein said cap may structurally support additional interconnect layers subsequently formed thereatop.

2. The interconnect structure of claim 1, wherein said starting structure further comprises:
    a plurality of voids between adjacent metallic conducting lines, said plurality of voids containing an insulative dielectric material therein.

3. The interconnect structure of claim 2, wherein said insulative dielectric material contained in said plurality of voids comprises air.

4. The interconnect structure of claim 2, wherein said insulative dielectric material contained in said plurality of voids comprises a vacuum.

5. The interconnect structure of claim 2, wherein said insulative dielectric material contained in said plurality of voids comprises one of: $N_2$, Ar, Xe, He, Kr or $SF_6$ gas.

6. The interconnect structure of claim 1, wherein said mesh openings are filled by chemical vapor deposition.

7. The interconnect structure of claim 1, wherein said mesh openings are filled by physical vapor deposition.

8. The interconnect structure of claim 1, wherein said cap is formed into a continuous surface by chemical mechanical polishing.

9. The interconnect structure of claim 1, wherein said cap is formed into a continuous surface by reactive ion etching (RIE).

10. The interconnect structure of claim 1, wherein said cap is formed into a continuous surface by wet etching.

11. A multilevel interconnect structure for an integrated circuit, comprising:
    a starting structure formed upon a substrate, said starting structure having a number of metallic conducting lines contained therein;
    the top of said starting structure immersed in a liquid bath, said liquid bath being cured into a solid surface, thereby forming a cap upon said starting structure;
    wherein said cap may structurally support additional interconnect layers subsequently formed thereatop.

12. The interconnect structure of claim 11, wherein said starting structure further comprises:
    a plurality of voids between adjacent metallic conducting lines, said plurality of voids containing an insulative dielectric material therein.

13. The interconnect structure of claim 12, wherein said liquid bath further comprises a liquid dielectric material, said liquid dielectric material initially having a liquid form at temperatures below 450° C. before curing thereof.

14. The interconnect structure of claim 13, wherein said liquid bath is cured by cooling said liquid bath below a melting temperature thereof.

15. The interconnect structure of claim 13, wherein said liquid bath is cured by irradiation.

16. The interconnect structure of claim 12, wherein said top of said starting structure is immersed in said liquid bath to a selected depth.

17. The interconnect structure of claim 12, wherein said top of said starting structure is placed in a vessel, said vessel containing a film of said liquid bath, said film having a thickness conforming to the desired thickness of said cap.

18. The interconnect structure of claim 12, wherein said insulative dielectric material comprises air.

19. The interconnect structure of claim 1, wherein said mesh openings are filled by a liquid, said liquid being cured into a solid surface.

20. The interconnect structure of claim 19, wherein said starting structure further comprises:
    a plurality of voids between adjacent metallic conducting lines, said plurality of voids comprising an insulative dielectric material between said adjacent metallic conducting lines.

21. The interconnect structure of claim 20, wherein said insulative dielectric material is air.

22. The interconnect structure of claim 19, wherein said liquid further comprises a liquid dielectric material, said liquid dielectric material initially having a liquid form at temperatures below 450° C. before curing thereof.

23. The interconnect structure of claim 22, wherein said liquid is cured by cooling said liquid below a melting temperature thereof.

24. The interconnect structure of claim 23, wherein said liquid is cured by irradiation.

25. The interconnect structure of claim 19, wherein said top of said starting structure is immersed in said liquid to a selected depth.

26. The interconnect structure of claim 19, wherein said disk further comprises a catalytic material, said catalytic material promoting said curing said liquid into a solid surface.

27. The interconnect structure of claim 26, wherein said catalytic material further comprises mesoporous zeolites implanted with a heavy metal.

28. The interconnect structure of claim 27, wherein said heavy metal is platinum.

29. The interconnect structure of claim 27, wherein said heavy metal is palladium.

30. The interconnect structure of claim 27, wherein said heavy metal is ruthenium.

* * * * *